(12) United States Patent
Kawano et al.

(10) Patent No.: US 8,310,837 B2
(45) Date of Patent: Nov. 13, 2012

(54) CIRCUIT MODULE AND POWER LINE COMMUNICATION APPARATUS

(75) Inventors: Hiroshi Kawano, Miyazaki (JP);
Munenori Fujimura, Miyazaki (JP);
Takumi Naruse, Miyazaki (JP);
Shuichiro Yamaguchi, Miyazaki (JP);
Yoshinori Hashimoto, Miyazaki (JP)

(73) Assignee: Panasonic Corporation, Osaka (JP)

( * ) Notice: Subject to any disclaimer, the term of this patent is extended or adjusted under 35 U.S.C. 154(b) by 899 days.

(21) Appl. No.: 11/734,386

(22) Filed: Apr. 12, 2007

(65) Prior Publication Data

US 2008/0123302 A1     May 29, 2008

(30) Foreign Application Priority Data

Apr. 13, 2006   (JP) .............................. P. 2006-110769

(51) Int. Cl.
*H05K 1/18* (2006.01)
(52) U.S. Cl. .................. 361/761; 361/782; 361/780
(58) Field of Classification Search .................. 361/764, 361/782, 780; 333/204
See application file for complete search history.

(56) References Cited

U.S. PATENT DOCUMENTS

| | | | |
|---|---|---|---|
| 5,142,430 A * | 8/1992 | Anthony | 361/56 |
| 5,488,540 A | 1/1996 | Hatta | |
| 5,736,965 A | 4/1998 | Mosebrook et al. | |
| 6,038,133 A | 3/2000 | Nakatani et al. | |
| 6,150,724 A * | 11/2000 | Wenzel et al. | 257/777 |
| 6,246,112 B1 | 6/2001 | Ball et al. | |
| 6,338,767 B1 | 1/2002 | Nakatani et al. | |
| 6,392,491 B1 * | 5/2002 | Ohkawa et al. | 330/306 |
| 6,528,732 B1 * | 3/2003 | Okubora et al. | 174/255 |
| 6,625,037 B2 | 9/2003 | Nakatani et al. | |
| 7,045,901 B2 * | 5/2006 | Lin et al. | 257/778 |
| 7,068,519 B2 | 6/2006 | Nakatani et al. | |
| 7,233,502 B1 * | 6/2007 | Chang | 361/800 |
| 2001/0024148 A1 * | 9/2001 | Gerstenberg et al. | 333/185 |
| 2002/0011662 A1 | 1/2002 | Komiya et al. | |
| 2003/0174479 A1 * | 9/2003 | Shimura et al. | 361/764 |
| 2004/0264095 A1 * | 12/2004 | Block et al. | 361/119 |
| 2005/0026587 A1 | 2/2005 | Miskho | |
| 2005/0053226 A1 * | 3/2005 | Taniguchi et al. | 379/390.02 |
| 2005/0200002 A1 * | 9/2005 | Yamashita | 257/723 |
| 2005/0288392 A1 | 12/2005 | Okubora | |
| 2006/0055601 A1 * | 3/2006 | Kameda et al. | 343/700 MS |

(Continued)

FOREIGN PATENT DOCUMENTS

EP              1553630              7/2005

(Continued)

OTHER PUBLICATIONS

English Language Abstract of JP 11-220262.

(Continued)

*Primary Examiner* — Tuan T Dinh
*Assistant Examiner* — Steven Sawyer
(74) *Attorney, Agent, or Firm* — Greenblum & Bernstein, P.L.C.

(57) ABSTRACT

A circuit module is mounted with an IC that modulates and demodulates a multicarrier signal. The circuit module has a laminated board, which is provided internally with a plurality of conductive layers laminated having insulating layers in between, and an IC, which is provided with a plurality of ground terminals to be grounded. Of the plurality of conductive layers, a conductive layer provided proximate to the IC configures a ground layer electrically connected to the plurality of ground terminals.

15 Claims, 22 Drawing Sheets

U.S. PATENT DOCUMENTS

2006/0202312 A1* 9/2006 Iijima et al. .................. 257/664
2008/0117609 A1* 5/2008 Itou et al. ..................... 361/761

FOREIGN PATENT DOCUMENTS

| | | |
|---|---|---|
| JP | 6-104577 | 4/1994 |
| JP | 7-245576 | 9/1995 |
| JP | 2000-031329 | 1/2000 |
| JP | 2000-504890 | 4/2000 |
| JP | 2001-77537 | 3/2001 |
| JP | 2001-345419 | 12/2001 |
| JP | 3375555 | 11/2002 |
| JP | 2004-119483 | 4/2004 |
| JP | 2005-253115 | 9/2005 |
| RU | 2161382 | 12/2000 |
| WO | 2006/014026 | 2/2006 |

OTHER PUBLICATIONS

English Language Abstract of JP 2000-031329.
English Language Abstract of JP 7-245576.

\* cited by examiner

CIRCUIT MODULE AND POWER LINE COMMUNICATION APPARATUS

BACKGROUND OF THE INVENTION

1. Field of the Invention

The present invention relates to a circuit module (i.e., substrate), particularly to a mounting structure of a semiconductor IC used in an environment where noise control is difficult, such as high-speed power line communication (PLC) and the like.

2. Description of Related Art

With demand for compact electronic components, numerous IC chips and IC components need to be mounted on a circuit module having semiconductor ICs and IC components. Demand has thus been growing for the effective use of wiring and mounting space. Particularly, a modulation/demodulation IC, which modulates and demodulates signals, is provided with a large number of ground terminals (pads) at a narrow pitch, each of which is connected onto a mounting board. Used as the mounting board is a laminated board, which includes a plurality of laminated wiring layers having an insulating layer in between (e.g., Japanese Patent No. 3,375,555 and Japanese Patent Laid-open Publication No. 2000-031329). In order to minimize wire routing and to reduce impedance attributed to wiring itself, a power line and a ground line included in the wiring layers normally have a planar shape, and are mounted in the laminated board as a power plate and a ground plate respectively.

When such a conventional power plate or ground plate is mounted in the laminated board as an internal layer, determining a particular mounting position is handled as a design matter. When the ground plate that configures ground layer 2200 is provided away from modulation/demodulation IC 2100 as shown in FIG. 19, for instance, a via needs to be provided to a predetermined depth for electrical connection between a ground terminal and the ground plate. It is easy to process via hole (hereinafter referred to as through-via) H that penetrates entire laminated board 1000. However, such a deep through-via requires a large planar space and a space on a rear side, thus wasting the mounting and wiring spaces. Further, a vertical distance cannot be overlooked, and an increase in inductance caused by the increased thickness of the laminated board is not a small problem.

It is possible to provide the via only to the middle in order to secure the mounting space. There is a problem, however, where the farther the ground layer is provided from the ground terminal of modulation/demodulation IC 2100, the more the processing accuracy declines. In addition, the increase in inductance caused by the increased thickness of the laminated board is more than a small problem, as described above.

SUMMARY OF THE INVENTION

The present invention is provided to address the above-described problems. An object of the present invention is to provide a compact circuit module being hardly affected by noise and having high reliability. Another object of the present invention is to provide a compact, low-noise, and high-speed power line communication apparatus.

A circuit module explained in the embodiments below has a laminated board and an IC; the laminated board having a first insulating layer, a first conductive layer laminated on the first insulating layer, a second insulating layer laminated on the first conductive layer, and a second conductive layer laminated on the second insulating layer; the IC being mounted on the first insulating layer and having a plurality of ground terminals. The first conductive layer is electrically connected to the plurality of ground terminals. The above-described structure provides a minimum distance between the ground terminals and a ground layer and connects the ground terminals and the ground layer while requiring no via hole that penetrates the laminated board and maintaining processing accuracy. Thereby, a mounting space is not reduced on a rear surface of the laminated board, the rear surface being a surface on which no IC is mounted. Further, an increase in inductance is minimized, which is caused by an increased thickness of the laminated board. The conductive layer provided proximate to the IC herein is a proximate layer, except a conductive layer that configures a wiring pattern as a connection pad on the laminated board surface.

Further, a circuit module explained in the embodiments below has a laminated board and an IC; the laminated board having a first insulating layer, a first conductive layer laminated on the first insulating layer, a second insulating layer laminated on the first conductive layer, and a second conductive layer laminated on the second insulating layer; the IC having a plurality of ground terminals and processing a high-frequency signal. The IC is mounted on the first insulating layer, and the plurality of ground terminals are electrically connected to the first conductive layer. The above-described structure provides a minimum distance between the ground terminals and a ground layer and connects the ground terminals and the ground layer while requiring no via hole that penetrates the laminated board and maintaining processing accuracy. Thereby, a mounting space is not reduced on a rear surface of the laminated board, the rear surface being a surface on which no IC is mounted. Further, an increase in inductance is minimized, which is caused by an increased thickness of the laminated board, thereby preventing attenuation of the high-frequency signal processed by the IC. The conductive layer provided proximate to the IC herein is a proximate layer, except a conductive layer that configures a wiring pattern as a connection pad on the laminated board surface.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The embodiments are explained in the following, with reference to the above-described drawings.

First Embodiment

Explained in a first embodiment is PLC modem 100, as an IC mounting board, which stores in case 101 a PLC board used for high-speed power line communication (PLC). PLC modem 100 is an example of a PLC apparatus, which may be an electrical apparatus having a PLC modem therein.

Figure 1:
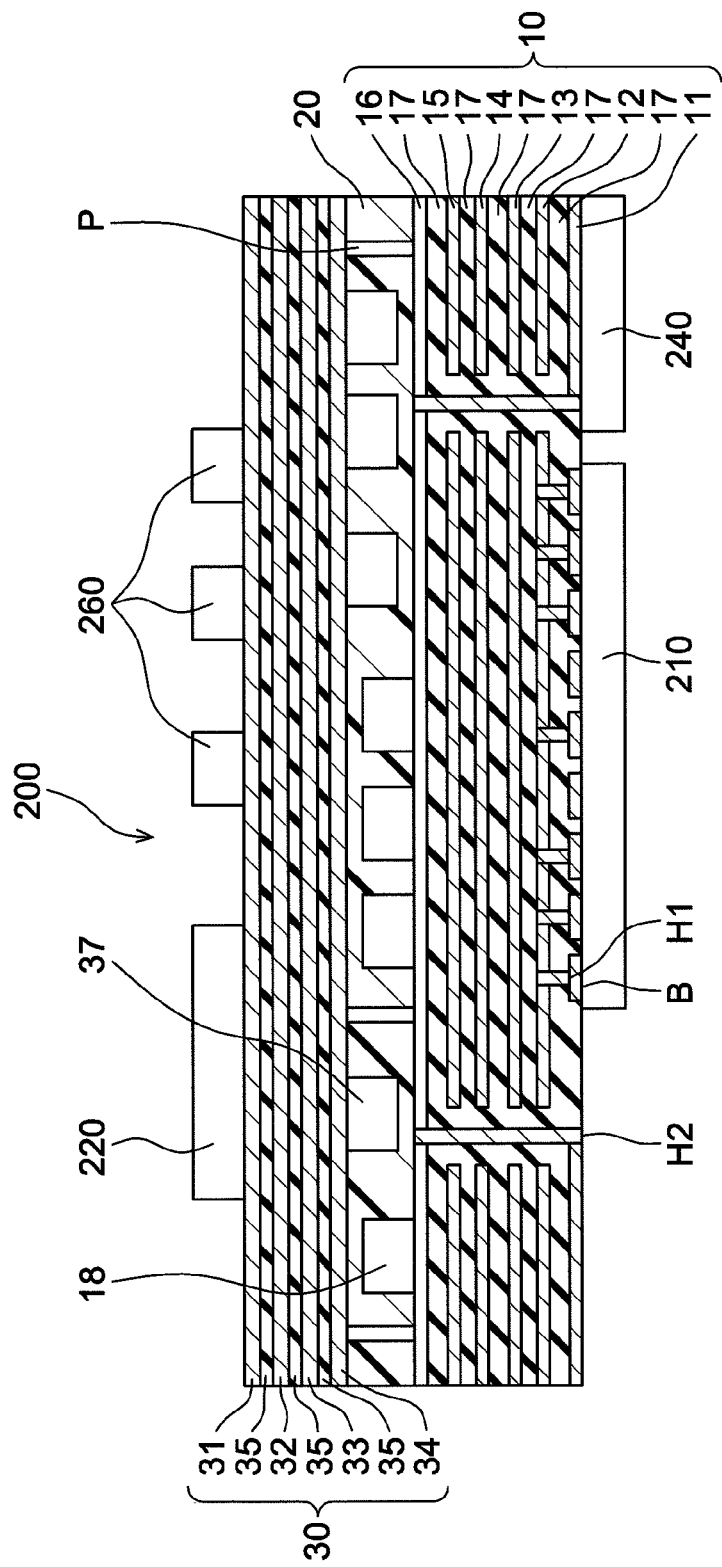
FIG. 1 is a sectional view illustrating a power line communication (PLC) circuit module that employs an IC mounting board according to a first embodiment.
Figure 2:
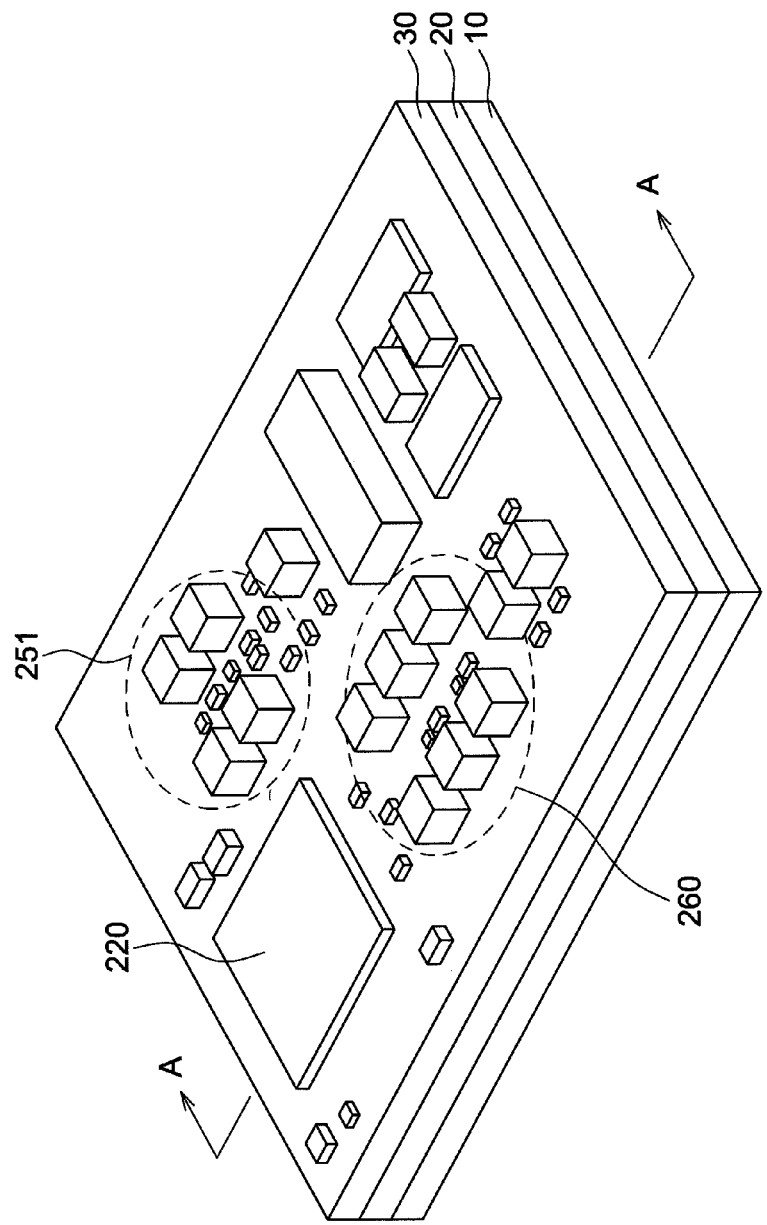
FIG. 2 is a perspective view illustrating the PLC circuit module according to the first embodiment.

In the first embodiment, PLC circuit module 200 includes two IC mounting boards as shown in FIGS. 1 and 2. More specifically, in first laminated board 10, which is one of the two IC mounting boards that configure PLC circuit module 200 mounted in PLC modem 100, first metal layer 12 is a conductive layer provided proximate to modulation/demodulation IC 210 as an IC, and is electrically connected to a ground terminal of modulation/demodulation IC 210.

As shown in FIGS. 1 and 2 (FIG. 1 is a sectional view of section A-A of FIG. 2), first laminated board 10 is fixedly attached to second laminated board 30 having therebetween composite sheet 20 as an insulating sheet, in the first embodiment. First laminated board 10 is mounted with modulation/demodulation IC 210, which is an IC that modulates and demodulates a multicarrier signal. In first laminated board 10 of the two laminated boards, each layer of first to fourth metal layers 12 to 15 is laminated and fixedly attached having insulating layer 17 in between. Wiring patterns 11 and 16 configure wiring on front and rear surfaces of the laminated board. The wiring patterns are provided in a similar manner to the first to fourth metal layers and function as pads for connection. A proximate layer is first metal layer 12. In second laminated board 30, each layer of first and second metal layers 32 and 33, which configure wiring patterns, is laminated and fixedly attached having insulating layer 35 in between. Wiring patterns 31 and 34 configure wiring on front and rear surfaces of the laminated board. The wiring patterns are provided in a similar manner to the first and second metal layers and function as pads for connection. Second laminated board 30, which is provided in a similar manner to first laminated layer 10, is mounted on the surface thereof with AFE IC (analog front end IC) 220 and balanced filter 251 (260). A circuit structure of PLC circuit module 200 that includes modulation/demodulation IC 210 will be described hereinafter.

As shown in FIGS. 1 and 2, PLC circuit module 200 provided with the two IC mounting boards and stored in PLC modem 100, has first laminated board 10 and second laminated board 30 which are fixedly attached and laminated having insulating sheet 20 therebetween. Modulation/demodulation IC 210 is mounted on the rear surface of first laminated board 10. Low pass filter 251 and band pass filter 260, which are balanced filters, and AFE IC 220 are mounted on the front surface of second laminated board 30. First laminated board 10 includes wiring layers 11 and 16, which include pads on the front and rear surfaces; and laminated metal layers 12, 13, 14, and 15 having insulating layer 17 in between. Among the four metal layers, first metal layer 12 is provided as a ground layer proximate to the modulation/demodulation IC on the rear surface. First metal layer 12 is connected to pad B of wiring pattern 11 through-via hole H1 and then to modulation/demodulation IC 210.

As described above, first and second laminated boards 10 and 30 are used as the IC mounting boards provided in PLC circuit module 200. More specifically, first laminated board 10, which is mounted with modulation/demodulation IC 210 as the IC for modulating and demodulating a multicarrier signal, is fixedly attached to second laminated board 30 while having composite sheet 20 in between as the insulating sheet. In second laminated board 30, each of the plurality of metal layers 32 and 33 is laminated and fixedly attached having insulating layer 35 in between. Second laminated board 30 is also provided with metal layers 31 and 34, which configure pads, on the front and rear surfaces (refer to FIG. 1).

The structure above minimizes a distance between a bonding pad (not shown in the drawings), which is the ground terminal of modulation/demodulation IC 210; and first metal layer 12, which configures the ground layer. The structure thus allows the ground terminal and the ground layer to connect through shallow inner via H1, which penetrates only surface insulating layer 17, while requiring no via to be provided to penetrate the laminated board. The structure is thereby capable of connecting the ground terminal and the ground layer while maintaining the processing accuracy. Consequently, the through-via does not reduce a mounting space on the rear surface of the laminated board, on which no IC is mounted, even when numerous ground terminal pins are provided. Further, an increase in inductance is minimized caused by an increased thickness of the laminated board.

First metal layer 12, which configures the ground layer of first laminated board 10, is patterned with copper foil so as to have a space of 80% or greater of the board surface. Provided on an upper layer side of first metal layer 12 (a side away from modulation/demodulation IC 210) is second metal layer 13, which is similarly patterned with copper foil and configures a power layer. Second metal layer 13 is connected through the inner via to a power terminal (not shown in the drawings) of modulation/demodulation IC 210, memory 240, and the like.

First and second laminated boards 10 and 30 are provided with insulating layers 17 and 35; metal layers 12, 13, 14, 15, 32, and 33; and wiring patterns 11, 16, 31, and 34. The insulating layers sandwich the metal layers, which configure patterns, including the ground layer, the power layer, the wiring layer, and the like. The wiring patterns configure the connecting pads on the front and rear surfaces. The layers and patterns are electrically connected through the via holes provided in insulating layer 17. The via holes can be provided by, for example, laser processing, drilling, or die processing. Laser processing is preferable since the method provides via holes at a fine pitch and produces no shaving. Laser processing is easily performed when a carbon dioxide laser or an excimer laser is used. For the electrical connection, nonelectrolytic plating may be performed or a conductive substance may be filled.

Further, copper foil is used for metal layers 11, 12, 13, 14, 15, and 16 (31, 32, 33, and 34), which configure the wiring patterns, the ground layer, and power layer. However, any electrical conductive substance may be used, such as a conductive resin composition and the like. When copper foil is used for the wiring pattern, for example, electrolytic plated copper foil having a thickness of about 12 μm to 35 μm can be applied. In order to improve adhesion of the copper foil to insulating layers 17 and 35, it is preferable to roughen surfaces that contact insulating layers 17 and 35. Copper foil whose surface is treated with a coupling agent or is plated with tin, zinc, or nickel may also be used in order to improve the adhesion and acid resistance. For the metal layer, a lead frame may be used, which is an etched or punched metal plate. Using the lead frame allows easy forming, since a green sheet, which is divided and provided per unit by printing or the like, is fixately attached onto the lead frame; components are mounted as required; a next insulating layer is laminated; a next metal layer is laminated; layers are subsequently laminated in a similar manner; and finally the lead frame is divided into a laminated board of the unit.

The composite sheet as insulating sheet 20, to which first and second laminated boards 10 and 30 are fixately attached, has a mixture that includes an inorganic filler and thermoset resin and is commonly called a green sheet. An unhardened sheet is laminated, in which holes for a circuit component or for a conductive path is provided as required. The sheet is then heated and dried at a temperature of around 200 degrees Celsius and is laminated while having the circuit component or the conductive path therein. The holes for the circuit component or the conductive path can be provided by, for example, laser processing, drilling, or die processing. Laser processing is preferable since the method provides though-holes at a fine pitch and produces no shaving. Laser processing is easily performed when a carbon dioxide laser or an excimer laser is used. The hole may be provided at the same time when the green sheet is formed using the mixture. As the inorganic filler, $Al_2O_3$, $MgO$, $BN$, $AlN$, $SiO_2$, or the like can be used, for example. It is preferable that the inorganic filler has a weight percentage of 70% to 95% to the mixture. It is preferable that the inorganic filler has an average grain size of 0.1 μm to 100 μm or less. Preferable thermoset resin is, for instance, high heat-resistant epoxy resin, phenol resin, or cyanate resin. The epoxy resin is particularly preferable since heat resistance thereof is especially high. The mixture may include a dispersant, a colorant, a coupling agent, or a release agent.

Since the mixture of the inorganic filler and the thermoset resin is used as a material for insulating sheet 20, unlike a ceramic board, the sheet does not need to be baked at high temperature and can be provided by drying at a temperature of around 200 degrees Celsius. Thus, manufacturing is easy.

Further, the linear expansion coefficient, thermal conductivity, and permittivity of insulating sheet 20 can be easily controlled by selecting the inorganic filler to be used for insulating sheet 20. Substantially equalizing the linear expansion coefficient of insulating sheet 20 and a semiconductor element can prevent a crack and the like caused by temperature change, thus providing a highly reliable IC mounting board. Improving the thermal conductivity of insulating sheet 20 provides a highly reliable IC mounting board even when circuit components are mounted in high density.

Planar insulating sheet 20 may be heat-treated at a temperature lower than a hardening temperature of the thermoset resin. Heat treatment removes adhesion while maintaining flexibility of insulating sheet 20, thus allowing easy treatment thereafter. Further, heat-treating a mixture in which thermoset resin is solved with a solvent, partially removes the solvent.

Conductive path P provided in insulating sheet 20 has a thermoset conductive substance, for example. As the thermoset conductive substance, a conductive resin composition mixture of metal particles and thermoset resin can be used, for instance. As the metal particles, gold, silver, copper, or nickel can be used. Gold, silver, copper, and nickel are preferable conductive substances due to their high conductivity. Copper is particularly preferable because of its high conductivity and limited migration. As the thermoset resin, for instance, epoxy resin, phenol resin, or cyanate resin can be used. The epoxy resin is particularly preferable because of its high heat resistance.

Circuit components 18 and 37 provided in insulating sheet 20 may be either an active component or a passive component. Used as the active component is a semiconductor element, such as a transistor, an IC, an LSI, or the like. The semiconductor elements may be a semiconductor bare chip or a resin-sealed semiconductor element. Used as the passive component is a chip resistance, a chip capacitor, a chip inductor, or the like. The circuit component does not need to include the active component.

Further, using insulating sheet 20 shields internally provided circuit components 18 and 37 from external air, thus preventing a decline in reliability affected by humidity.

Figure 3A:
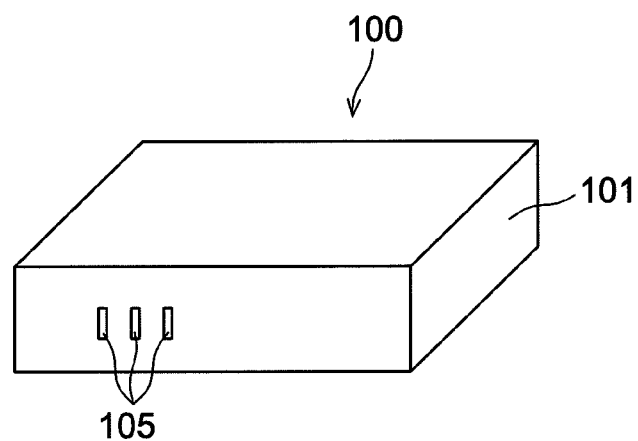
FIGS. 3A and 3B are external views illustrating a PLC modem according to the first embodiment.
Figure 3B:
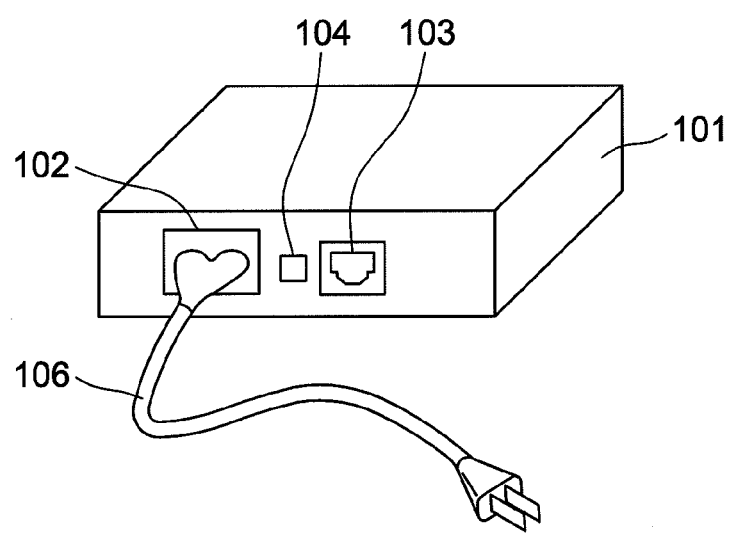
Figure 4:
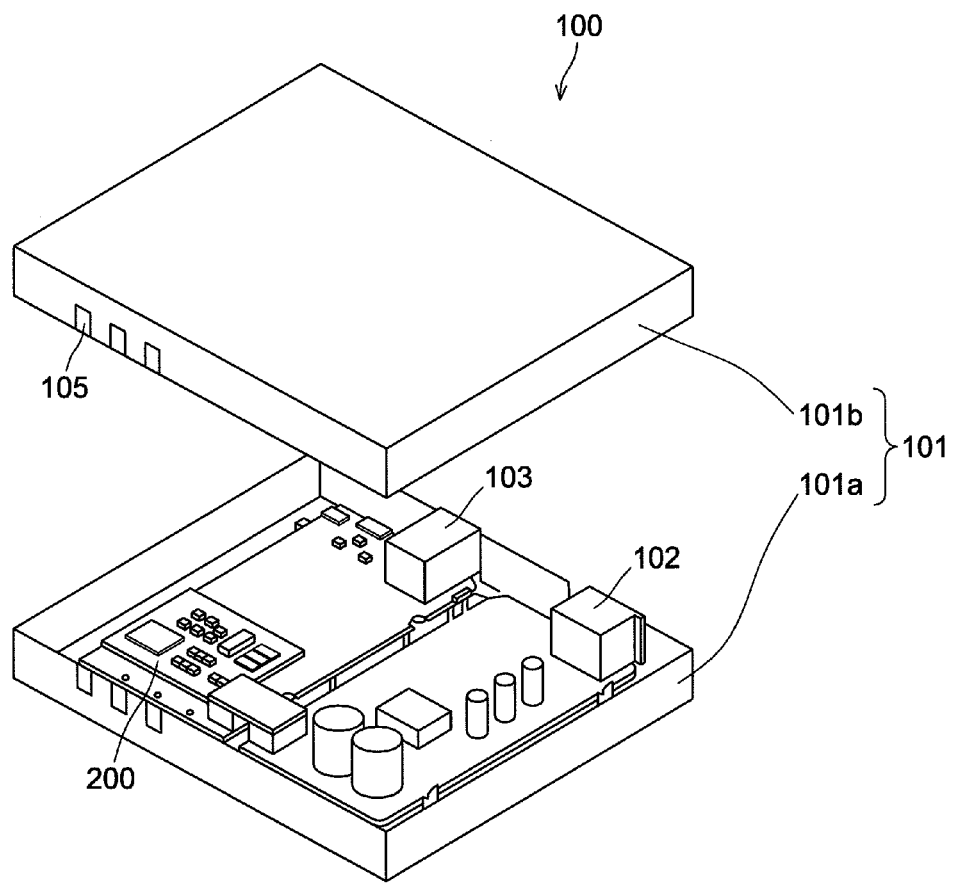
FIG. 4 is an exploded perspective view illustrating the PLC modem according to the first embodiment.

Described below are details on a PLC modem that employs the first laminated board (and the second laminated board) as an IC mounting board used as a module for high-speed power line communication. As shown in FIGS. 3A, 3B, and 4, PLC modem 100 has case 101 including upper case 101a and lower case 101b. On a front surface of case 101, display 105 including an LED (Light Emitting Diode) and the like, is provided as shown in FIG. 3A. Provided on a rear surface of case 101 are power connector 102; modular jack 103 for LAN (Local Area Network), such as RJ-45; and switch 104 for switching an operation mode, as shown in FIG. 3B. Power cable 106 is connected to power connector 102. A LAN cable (not shown in the drawings) is connected to modular jack 103. PLC modem 100 may be provided with a D-sub connector for D-sub cable connection.

Figure 5:
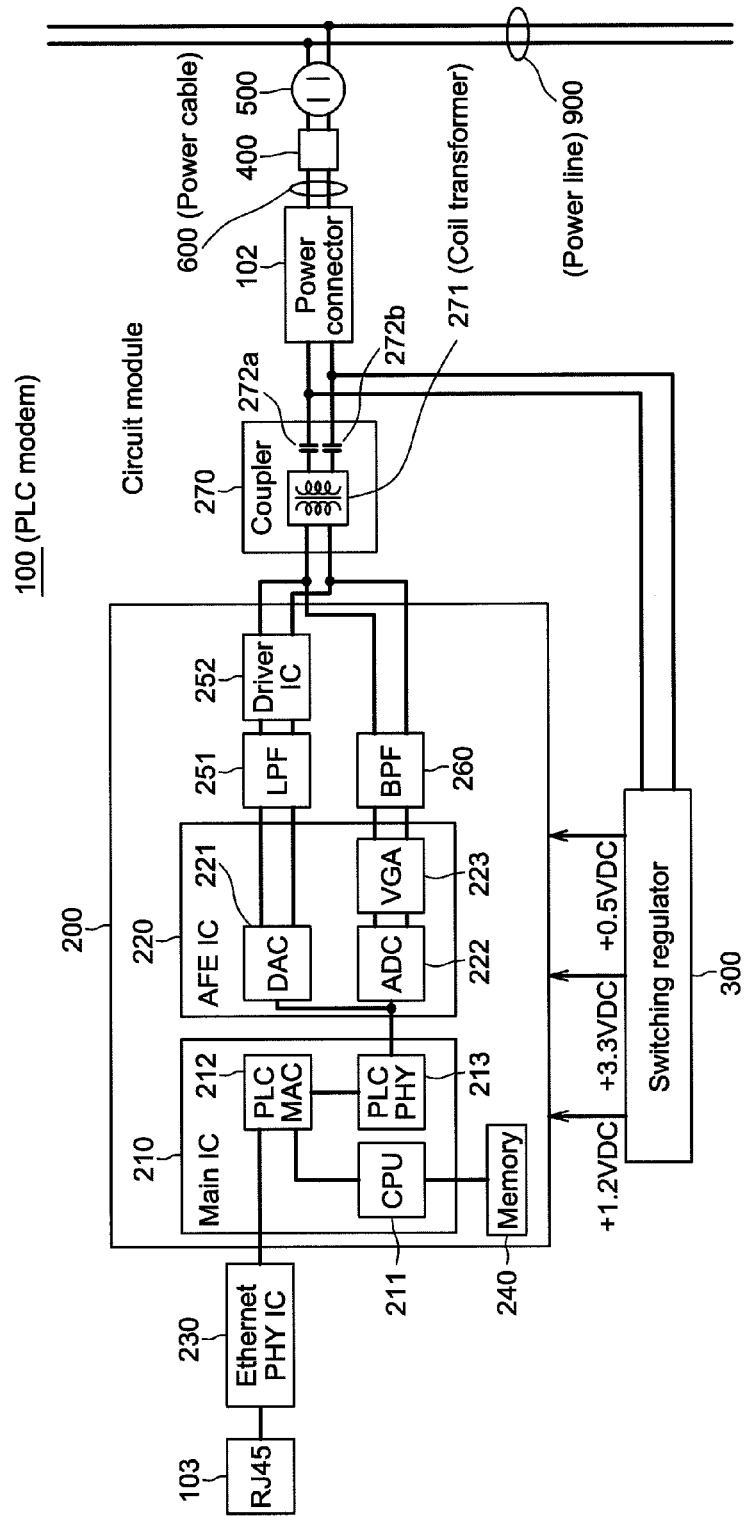
FIG. 5 is a block diagram illustrating a hardware example of the PLC modem according to the first embodiment.

PLC modem 100 has PLC circuit module 200 and switching regulator 300, as shown in FIG. 5. Switching regulator 300 supplies a variety of voltages (e.g., +1.2V, +3.3V, and +10.5V) to PLC circuit module 200. Switching regulator includes, for example, a switching transformer and a DC-DC converter (neither not shown in the drawing).

PLC circuit module 200 is provided with main IC 210 as a modulation/demodulation IC, AFE (Analog Front End) IC 220, memory 240, low pass filter 251, driver IC 252, and band pass filter 260. Switching regulator 300 and coupler 270 are connected to power connector 102, then to power line 900 via power cable 600, power plug 400, and outlet 500.

Main IC 210 includes CPU (Central Processing Unit) 211, PLC MAC (Power Line Communication Media Access Control layer) block 212, and PLC PHY (Power Line Communication Physical layer) block 213. CPU 211 is mounted with a 32-bit RISC (Reduced Instruction Set Computer) processor. PLC MAC block 212 controls a MAC layer of transmitted and received signals; PLC PHY block 213 controls a PHY layer of the transmitted and received signals. AFE IC 220 includes DA converter (DAC) 221, AD converter (ADC) 222, and variable gain amplifier (VGA) 223. Coupler 270 includes coil transformer 271, and coupling capacitors 272a and 272b. Further, CPU 211 uses data stored in memory 240 so as to control operations in PLC MAC block 212 and PLC PHY block 213 and to control entire PLC modem 100.

PLC modem 100 performs transmission in an OFDM system and the like that use a plurality of subcarriers. Digital signal processing for such transmission is performed in main IC 210, particularly in PLC PHY block 213.

Figure 6:
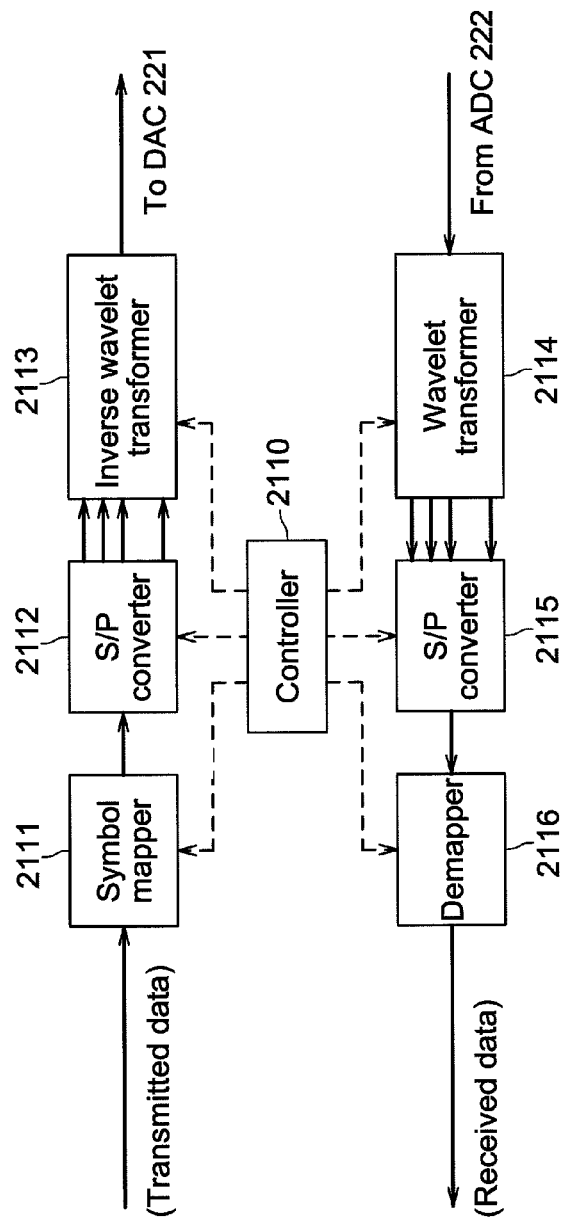
FIG. 6 is a general function block diagram illustrating an example of a digital signal processor provided by main IC 210 of the PLC module according to the first embodiment.

FIG. 6 is a general function block diagram illustrating an example of a digital signal processor of main IC 210 for OFDM transmission using wavelet transform. The digital signal processor of FIG. 6 includes controller 2110, symbol mapper 2111, serial-parallel converter (S/P converter) 2112, inverse wavelet transformer 2113, wavelet transformer 2114, parallel-serial converter (P/S converter) 2115, and demapper 2116.

Symbol mapper 2111 converts bit data to be transmitted into symbol data, and performs symbol mapping (e.g., PAM modulation) according to each of the symbol data. S/P converter 2112 converts the mapped serial data into parallel data. Inverse wavelet transformer 2113 performs inverse wavelet transform of the parallel data into data on a time scale, and generates a series of sample values that represent transmission symbols. The data are transferred to DA converter (DAC) 221 of AFE IC 220.

Wavelet transformer 2114 performs discrete wavelet transform of received digital data (a series of sample values sampled at the same rate as transmitted), which are obtained from AD converter (ADC) 222 of AFE IC 220, into data on a frequency scale. P/S converter 2115 converts the parallel data on the frequency scale into serial data. Demapper 2116 calculates an amplitude value of each subcarrier so as to determine a received signal and obtain received data.

An overview of the communication performed by PLC modem 100 is as follows. When data input from modular jack 103 are received, the data are transferred to main IC 210 via Ethernet PHY IC 230. A transmitted digital signal generated through digital signal processing is converted into an analog signal by DA converter (DAC) 221 of AFE IC 220. The analog signal is then output to power line 900 via low pass filter 251, driver IC 252, coupler 270, power connector 102, power cable 600, power plug 400, and outlet 500.

When a signal is received from power line 900, the signal is transferred to band pass filter 260 via coupler 270. After the gain is adjusted in variable gain amplifier (VGA) 223 of AFE IC 220, the signal is converted into a digital signal at AD converter (ADC) 222. The signal is then transferred to main IC 210, and converted into digital data through digital signal processing. Then, the data are output from modular jack 103 via Ethernet PHY IC 230.

Figure 7A:
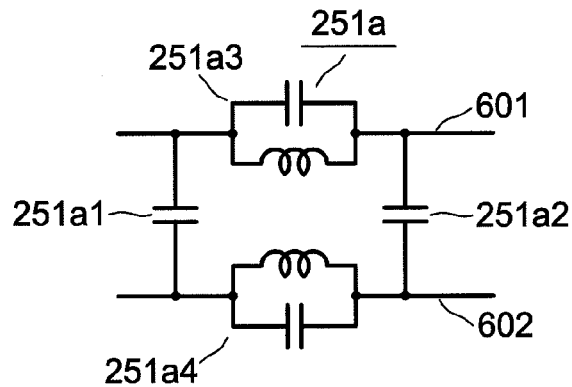
FIGS. 7A to 7C are equivalent circuit schematics illustrating a balanced filter used in the PLC circuit module according to the first embodiment.
Figure 7B:
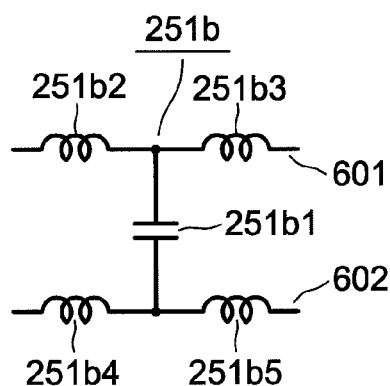

Low pass filter 251 herein provided on the transmitting side includes numerous capacitors and coils, as FIGS. 7A and 7B show equivalent circuit schematics thereof. Band pass filter 260 provided on the receiving side also includes numerous capacitors and coils, as FIG. 7C shows an equivalent circuit schematic thereof.

As shown in FIG. 7A, low pass filter 251a has two capacitors 251a1 and 251a2, which are connected between a pair of lines 601 and 602. CL parallel circuits 251a3 and 251a4 are connected in series to the pair of lines 601 and 602 respectively so as to be sandwiched between two capacitors 251a1 and 251a2. As shown in FIG. 7B, low pass filter 251b has one capacitor 251b1, which is connected between the pair of lines 601 and 602. Two inductors 251b2 and 251b3 are connected in series to line 601 so as to sandwich capacitor 251b1. Two inductors 251b4 and 251b5 are connected in series to line 602 so as to sandwich capacitor 251b1.

Lines 601 and 602 are connected to power line 900, which has a pair of lines, via power cable 600 shown in FIG. 5. When a circuit constant of CL parallel circuits 251a3 and 251a4 is equal, low pass filter 251a has equal impedance from each of the pair of lines of power line 900. Thus, low pass filter 251a configures a balanced filter. Further, when the circuit constant of inductors 251b2 and 251b3 and inductors 251b4 and 251b5 is equal, low pass filter 251b has equal impedance from each of the pair of lines of power line 900. Thus, low pass filter 251b configures a balanced filter, similar to low pass filter 251a. The structure above thus allows balancing of the pair of lines of the power line. Thereby, noise transmitted on a first line can counterbalance noise transmitted on a second line, thus suppressing the noise.

Figure 7C:
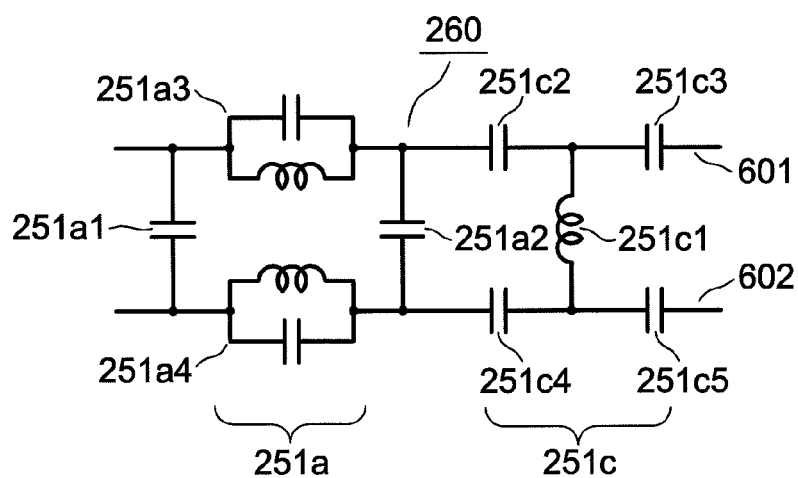

As shown in FIG. 7C, band pass filter 260 has low pass filter 251a shown in FIG. 7A and high pass filter 251c, which are connected in series to lines 601 and 602. High pass filter 251c has one inductor 251c1 connected between the pair of lines 601 and 602. Two capacitors 251c2 and 251c3 are connected in series to line 601 so as to sandwich inductor 251c1. Two capacitors 251c4 and 251c5 are connected in series to line 602 so as to sandwich inductor 251c1.

As shown in FIG. 7C, when the circuit constants of capacitors 251c2 and 251c3 and capacitors 251c4 and 251c5 are equal, band pass filter 260 has equal impedance from each of the pair of lines of power line 900. Thus, band pass filter 260 configures a balanced filter. The structure above thus allows balancing of the pair of lines of the power line. Thereby, the noise transmitted on the first line can counterbalance the noise transmitted on the second line, thus suppressing the noise.

The filters shown in FIGS. 7A to 7C have equal impedance from each of the pair of lines of power line 900. However, the impedance needs not to be completely equal, but may be substantially equal within a range of the effectiveness of noise suppression. For instance, an impedance difference of ±5% from each of the lines can achieve the effectiveness of noise suppression.

Figure 8A:
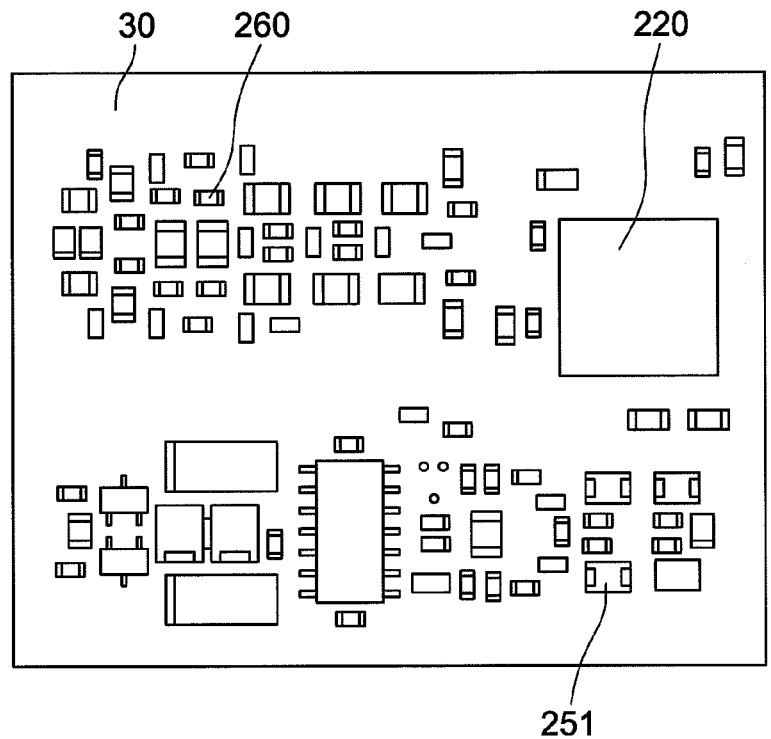
FIGS. 8A and 8B are front and rear views of a second laminated board used in the PLC circuit module according to the first embodiment.
Figure 8B:
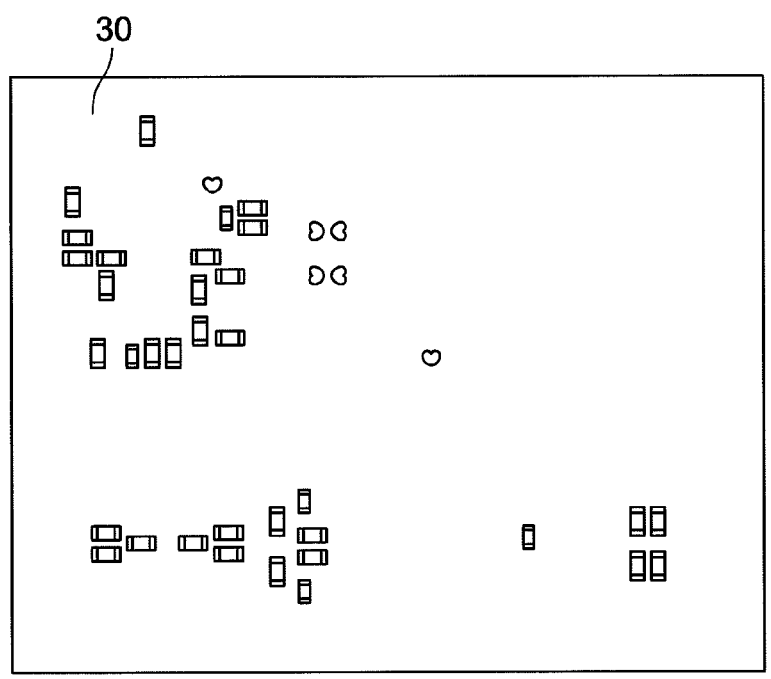
Figure 9A:
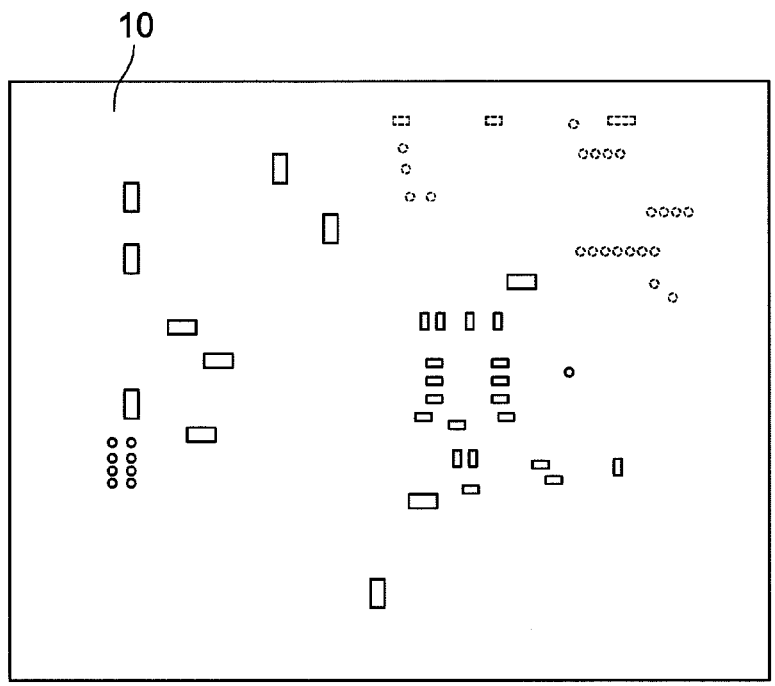
FIGS. 9A and 9B are front and rear views of a first laminated board used in the PLC circuit module according to the first embodiment.
Figure 9B:
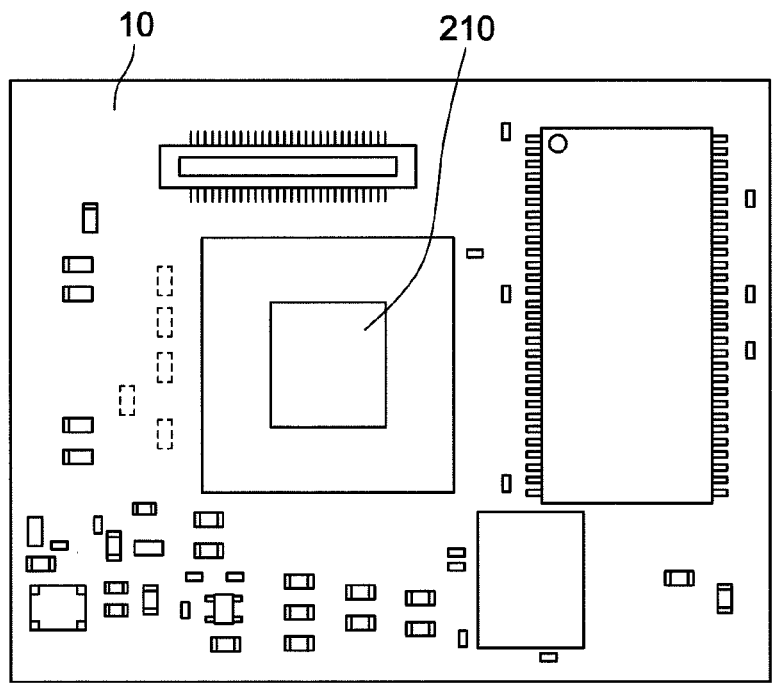

As described above, PLC circuit module 200 includes first laminated board 10 and second laminated board 30 having composite sheet 20 therebetween. As FIGS. 9A and 9B show front and rear surfaces of first laminated board 10, the board is provided with four metal layers 11, 12, 13, and 14 as internal layers, and is mounted with a relatively small component on the front surface side, and modulation/demodulation IC 210, memory 240, and the like on the rear surface side. As FIGS. 8A and 8B show front and rear surfaces of second laminated board 30, the board is provided with two metal layers 32 and 33 as internal layers, and is mounted with a relatively small component on the rear surface side, and balanced filters 251 and 260 and AFE IC 220 on the front surface side.

Explained below is a manufacturing method of PLC circuit module 200. FIGS. 10A to 10F are perspective views illustrating an embodiment of a manufacturing process of the PLC module. FIGS. 11A to 11F provide sectional views. FIGS. 12A to 12F are sectional views illustrating a manufacturing process of the first laminated board as the IC mounting board included in the PLC module. Prior to the explanation on the manufacturing process of the PLC module, a manufacturing process of the first laminated board is first described.

Figure 12A:
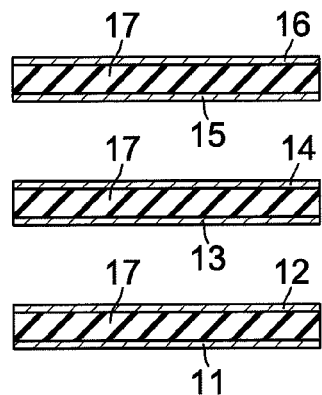
FIGS. 12A to 12F are sectional views illustrating a manufacturing process of the first laminated board used in the PLC module according to the first embodiment.

As shown in FIG. 12A, unhardened insulating layer 17 of glass woven-fabric impregnated with thermoset resin is first provided, and then is pasted on both sides thereof with copper foil as metal layers 11 and 12. Similarly prepared are insulating layer 17 pasted on both sides thereof with copper foil as metal layers 13 and 14, and insulating layer 17 pasted on both sides thereof with copper foil as metal layers 15 and 16. The both sides of the board are pressed while being heated so as to harden the resin of the insulating layer. An aramid nonwoven fabric or inorganic filler may be used as the material for the insulating layer. Epoxy resin is used as the thermoset resin, but phenol resin and the like may be used.

Figure 12B:
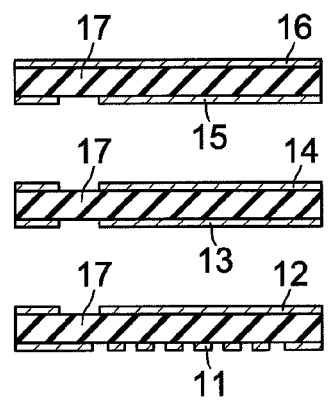
Figure 12C:
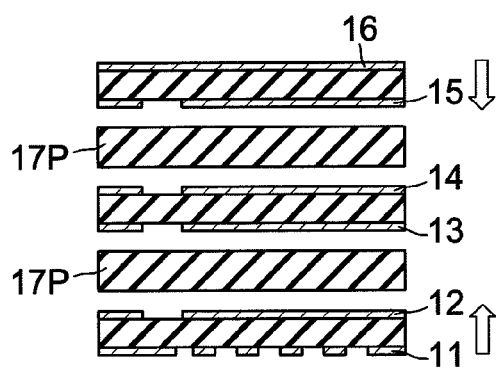

Thereafter, photolithography is used to pattern each of the metal layers so as to provide a wiring pattern, as shown in FIG. 12B. Then, insulating layer 17P called prepreg is inserted and is pressed while being heated, as shown in FIG. 12C. The positioned and laminated layers are pressed so as to provide a planar body. Then, the planar body is heated so as to harden the thermoset resin in insulating layers 17 and 17P and to provide a laminated body having six metal layers 11, 12, 13, 14, 15, and 16. Heating is performed at a temperature equal to or higher than a hardening temperature of the thermoset resin in insulating layers 17 and 17P (e.g., 150 degrees Celsius to 270 degrees Celsius), so as to turn the unhardened layers into insulating layer 17. When the thermoset resin in the unhardened insulating layers is heated for hardening, exerting a pressure of 10 kg/cm$^2$ to 200 kg/cm$^2$ while the resin is being heated improves the mechanical strength of the circuit component module.

Figure 12D:
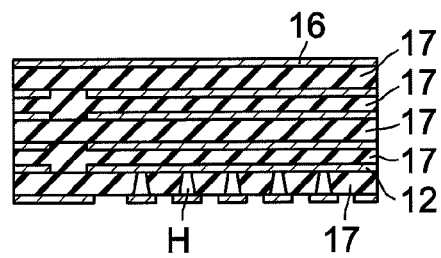

Thereafter, a laser is used to provide hole H to ground layer 15, as shown in FIG. 12D. As described earlier, hole H can be provided by laser processing, drilling, or die processing.

Figure 12E:
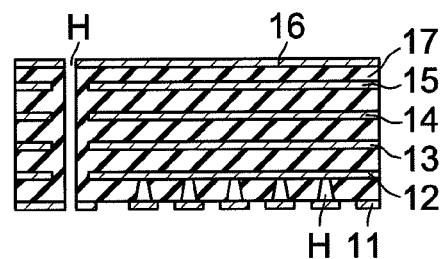
Figure 12F:
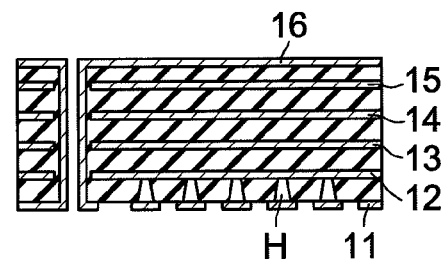

Then, through-hole H is provided so as to penetrate laminated board 10, as shown in FIG. 12E. Further, an inner surface of through-hole H is plated as shown in FIG. 12F, so as to electrically connect metal layer 16, ground layer 15, and the like, which work as pads. Through-hole H herein may be filled with a conductive resin composition. The first laminated board is provided as described above.

In the present embodiment, wiring patterns 11 and 16, which configure outermost layers, are also patterned, laminated, and finally provided with through-hole H, inside of which is plated. To connect the through-hole and wiring pattern 11, however, selective plating can be performed again so as to provide a plated layer from the inner surface of the through-hole up to wiring pattern 16 as the pad. As for the outermost layer, it is possible to paste copper foil lastly and perform pattering, so as to provide a pad on the through-hole.

Similarly, second laminated board 30 is provided. Although a different circuit component is mounted, the second laminated board is manufactured in a similar process to the first laminated layer.

Figure 10A:
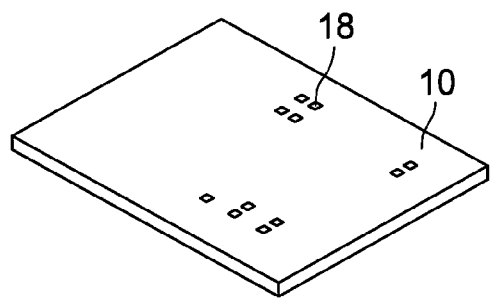
FIGS. 10A to 10F are perspective views illustrating an embodiment of a manufacturing process of the PLC module according to the first embodiment.
Figure 11A:
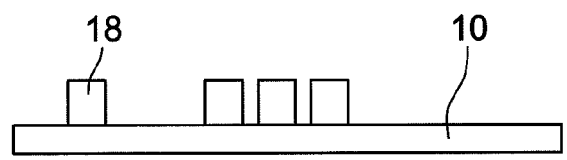
FIGS. 11A to 11F are sectional views illustrating an embodiment of a manufacturing process of the PLC module according to the first embodiment.

For mounting of the PLC module, circuit component 18 is first mounted on the upper surface of first laminated board 10, as shown in FIGS. 10A and 11A.

Figure 10B:
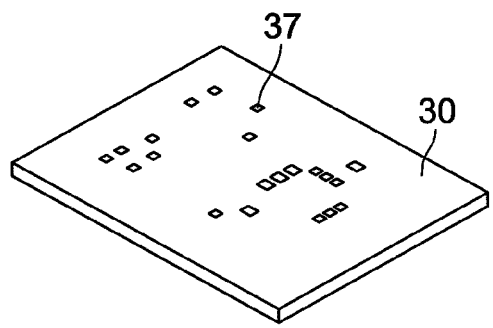
Figure 11B:
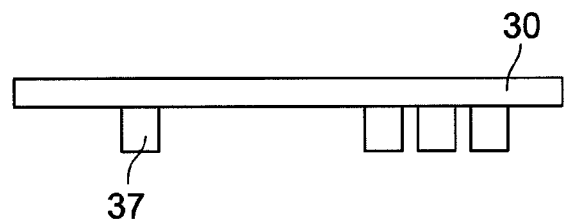

Then, circuit component 37 is mounted on the lower surface of second laminated board 30, as shown in FIGS. 10B and 11B.

Figure 10C:
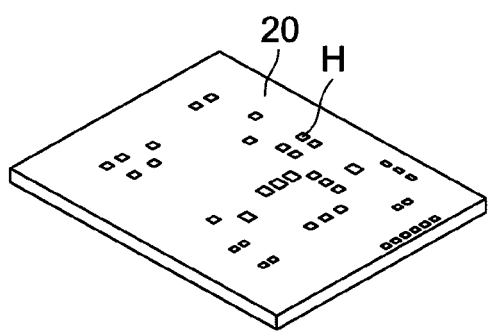
Figure 11C:
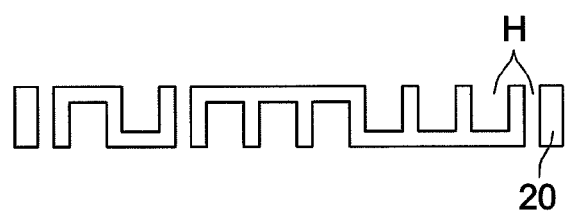

Thereafter, composite sheet 20 is provided, and through-hole H is provided for a component or a via (a conductive path), as shown in FIGS. 10C and 11C. Composite sheet 20 is formed of a mixture including an inorganic filler and thermoset resin so as to have a planar shape. Planar composite sheet 20 is obtained in a process where the inorganic filler and unhardened thermoset resin are mixed to provide a kneaded paste, which is then formed so as to have an even thickness. Then, through-hole H is provided for the via (the conductive path) at a predetermined position of planar composite sheet 20, and thereby the planer body having through-hole H is provided. Through-hole H can be provided, for example, by laser processing, drilling, or die processing. In this process, through-hole H may also be provided at the same time when planar composite sheet 20 is formed of the kneaded paste.

Figure 10D:
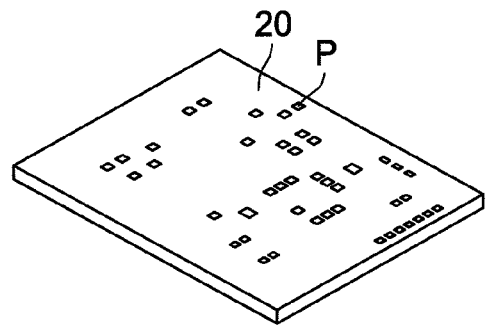
Figure 11D:
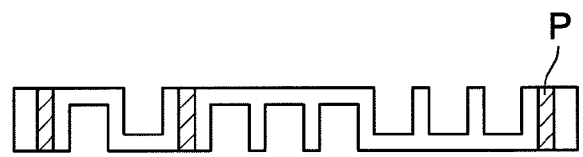

Subsequently, the conductive resin composition is filled to through-hole H so as to provide conductive path P, as shown in FIGS. 10D and 11D.

Figure 10E:
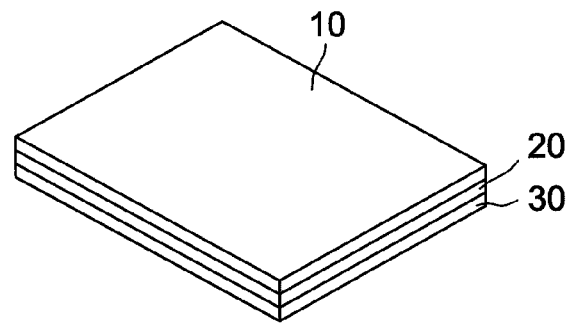
Figure 11E:
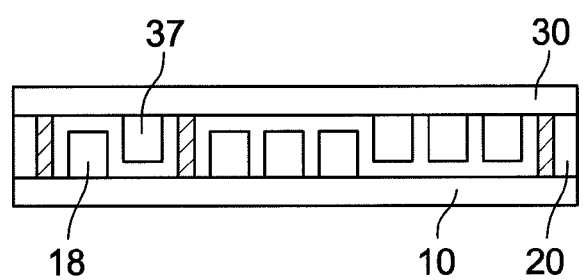
Figure 11F:
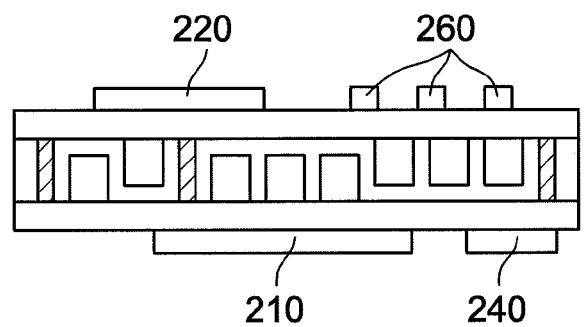

Then, the first and second laminated boards are positioned having composite sheet 20 therebetween, as shown in FIGS. 10E and 11E. The laminated materials are pressed so as to provide a planar body having circuit components 18 and 37 therein, and then are heated so as to harden the thermoset resin in insulating sheet 20 and the conductive resin composition. Thereby, the laminated body is provided having circuit components 18 and 37 between first laminated board 10 and second laminated board 30. Heating is performed at a temperature equal to or higher than a hardening temperature of the thermoset resin in composite sheet 20 and the conductive resin composition (e.g., 150 degrees Celsius to 260 degrees Celsius), so as to harden unhardened composite sheet 20. When the unhardened composite sheet is heated for hardening, exerting a pressure of 10 kg/cm$^2$ to 200 kg/cm$^2$ while the sheet is being heated improves the mechanical strength of the PLC circuit module.

Figure 10F:
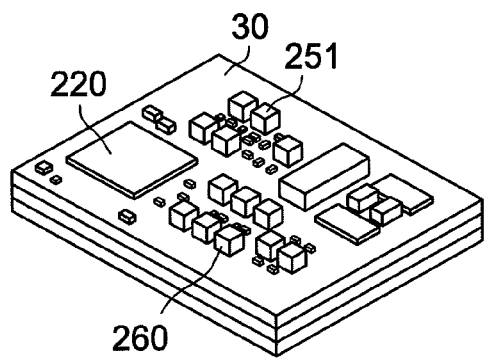

Thereafter, as shown in FIG. 10F, modulation/demodulation IC 210, memory 240, and the like are mounted on the lower surface of first laminated board 10; and AFE IC 220 and balanced filters 251 and 260 are mounted on the upper surface of second laminated board 30, thus completing the PLC module according to the present embodiment.

The PLC module provided as above is stored in cases 101a and 101b as shown in FIG. 4, and thereby the PLC modem is completed as shown in FIG. 4.

The PLC module according to the present embodiment is provided with the modulation/demodulation IC and the balanced filters on the different surfaces of the laminated boards, thereby reducing the impact of noise and thus providing a compact and affordable module having good properties.

A specific embodiment of the present invention is explained below, that is, an example of a manufacturing method of the IC mounting board included in the PLC module according to the present invention.

To make a planar composite sheet, a predetermined amount of paste mixture having predetermined compositions is first dropped on a mold-releasing film. The paste mixture is made of an inorganic filler and liquid thermoset resin, which are mixed for about 10 minutes in a mixer. The used mixer provides sufficient dispersion even when viscosity of the mixture is relatively high, since the inorganic filler and the liquid thermoset resin are placed in a container having a predetermined capacity and then the container itself is rotated. Used as the mold-releasing film is a polyethylene terephthalate film having a thickness of 75 μm, whose surface is release-treated with silicon.

Subsequently, a mold-releasing film is further placed on the paste mixture on the mold-releasing film. Then, the materials are pressed so as to have a thickness of 500 μm, and thereby a planar mixture is obtained. Then, the planar mixture sandwiched between the mold-releasing films is heated along with the films, and is heat-treated under a condition that removes adhesion from the planar mixture. The heat treatment is performed at a temperature of 120 degrees Celsius for a holding time of 15 minutes. The heat treatment removes the adhesion from the planar mixture, thus allowing easy removal of the mold-releasing films. Since the liquid epoxy resin used in the embodiment has a hardening temperature of 130 degrees Celsius, the resin is unhardened (B stage) under the heat processing condition.

Thereafter, the mold-releasing films are removed from the planar mixture. The planar mixture is then sandwiched between heat-resistant mold-releasing films (PPS or polyphenylene sulfide; a thickness of 75 µm) and is heated at a temperature of 170 degrees Celsius while being pressed at a pressure of 50 kg/cm$^2$ so as to be hardened.

Subsequently, the heat-resistant mold-releasing films are removed from the hardened planar mixture, and thereby an insulating layer is obtained. The insulating layer is processed so as to have predetermined dimensions, and then is measured for the thermal conductivity, the linear expansion coefficient, and the like. The thermal conductivity is obtained by contacting a surface of a sample, which is cut out so as to have a 10 mm square, to a heater for heating, and performing calculation from a temperature rise on the opposite surface. The linear expansion coefficient is obtained by measuring a change in the dimensions of the insulating layer when the temperature rises from room temperature to 140 degrees Celsius, and then calculating an average value of the dimension change. The dielectric strength voltage is obtained by measuring the dielectric strength voltage when an AC voltage is applied in a thickness direction of the insulating layer, and then calculating the dielectric strength voltage per unit thickness. The insulating layer herein means an electrically insulated board.

The insulating layer manufactured in the above-described method and having $Al_2O_3$ as an inorganic filler has a thermal conductivity about 10 times or greater than a conventional glass-epoxy board (a thermal conductivity of 0.2 w/mK to 0.3 w/mK). When an amount of $Al_2O_3$ is a weight percentage of 85% or higher, a thermal conductivity of 2.8 w/mK or higher is achieved. Further, $Al_2O_3$ is cost advantageous.

When AlN or MgO is used as the inorganic filler, a thermal conductivity equal to or higher than that of $Al_2O_3$ is obtained. Further, when amorphous $SiO_2$ is used as the inorganic filler, the linear expansion coefficient is closer to that of a silicon semiconductor (a linear expansion coefficient of $3\times10^{-6}$/C.°). Thus, it is preferable to use the insulating layer having amorphous $SiO_2$ as the inorganic filler, for a flip-chip board directly mounted with a semiconductor.

When $SiO_2$ is used as the inorganic filler, the insulating layer has a low permittivity. Further, $SiO_2$ is advantageous with a low specific gravity.

When BN is used as the inorganic filler, the insulating layer has a high thermal conductivity and a low linear expansion coefficient. Except a case where $Al_2O_3$ having a weight percentage of 60% is used as the inorganic filler, the insulating layer has a dielectric strength voltage of 10 kV/mm or higher. The dielectric strength voltage of the insulating layer is an indicator of adhesion between the inorganic filler and the thermoset resin, which are materials of the insulating layer. More specifically, when the adhesion between the inorganic filler and the thermoset resin is poor, a fine crack forms between the materials, thus decreasing the dielectric strength voltage. Such a fine crack eventually leads to a decline in reliability of a module having a circuit component therein. It is generally determined that the adhesion between the inorganic filler and the thermoset resin is good when the dielectric strength voltage is 10 kV/mm or higher. Thus, it is preferable that an amount of the inorganic filler be a weight percentage of 70% or higher.

Since the strength of the insulating layer declines when a low amount of the thermoset resin is contained, it is preferable that the thermoset resin have a weight percentage of 4.8% or higher.

In the present embodiment, epoxy resin manufactured by Nippon Pelnox Corporation (WE-2025; an acid anhydride hardener included) is used as the liquid epoxy resin. As the phenol resin, phenol resin manufactured by Dainippon Ink and Chemicals, Inc. (Phenolite VH4150) is used. As the cyanate resin, cyanate resin manufactured by Asahi-Ciba, Limited (AcroCy M-30) is used. In the present embodiment, carbon black or a dispersant is added as an additive. Sandwiching the composite sheet between first laminated board 10 and second laminated board 30 and pressing and heating the materials provides the IC mounting board according to the embodiment of the present invention. The first embodiment can be applied to the embodiments described below.

Second Embodiment

Figure 13:
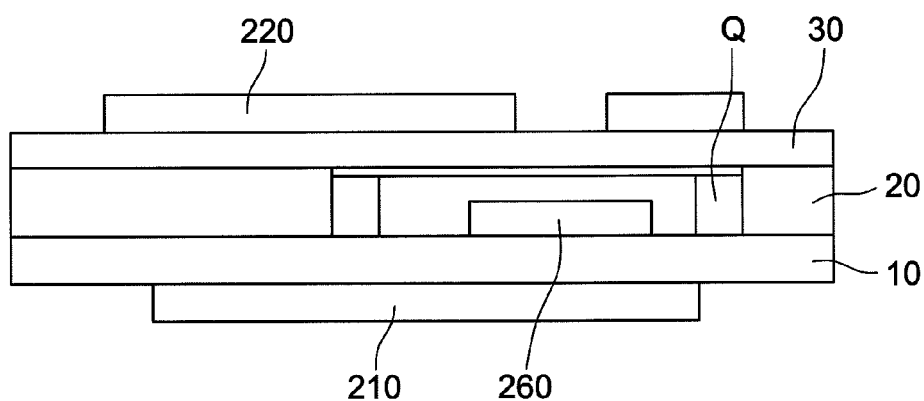
FIG. 13 illustrates a PLC circuit module according to a second embodiment.
Figure 14:
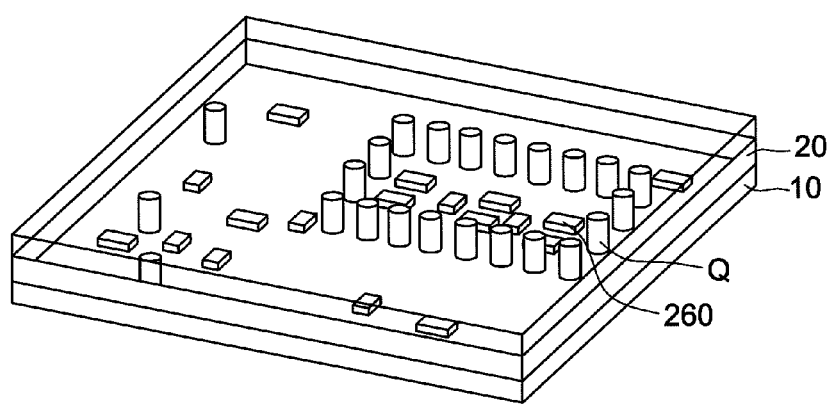
FIG. 14 illustrates the PLC circuit module according to the second embodiment.

A second embodiment is explained below. As shown in a sectional view in FIG. 13 and in a perspective view in FIG. 14, laminated board 10 as an IC mounting board according to the second embodiment is mounted with balanced filter 260 on a surface contacting a composite sheet between two laminated boards. Balanced filter 260 is surrounded along a circumference thereof by conductive pillars Q having conductive paste and providing conductive paths. Since similar processing is performed in processes of a manufacturing process of a PLC module in FIGS. 10C and 10D, man-hour can be minimized. Thereafter, the IC mounting board is provided in a similar manner to an IC mounting board shown in FIG. 1.

In the present embodiment, balanced filter 260 is mounted in insulating sheet 20 and is surrounded by conductive pillars Q having copper foil and conductive paste. Thereby, an impact of noise can be minimized and a compact and affordable module unaffected by a mounting environment can be provided.

Noise caused along with an increase in signal speed distorts signals on a transmitting/receiving analog circuit, represented as a balanced filter, and thus notably deteriorates the properties. A problem has been observed where an environment in which a module is installed (i.e., the noise is high or low) affects properties of the module. Particularly, high-speed power line communication (PLC) uses a frequency band having a low frequency of 4 MHz to 28 MHz and a wide range, and thus circuit elements provided in the filter circuit are large. Consequently, the noise inevitably travels into the filter circuit, and thereby the deterioration in the properties is particularly notable. The present embodiment solves the above-described problems and provides a compact and affordable module.

It is also possible to further improve shielding effect by replacing the metal particles contained in the conductive paste in the above-described embodiment with ferrite particles and the like.

Third Embodiment

Figure 15:
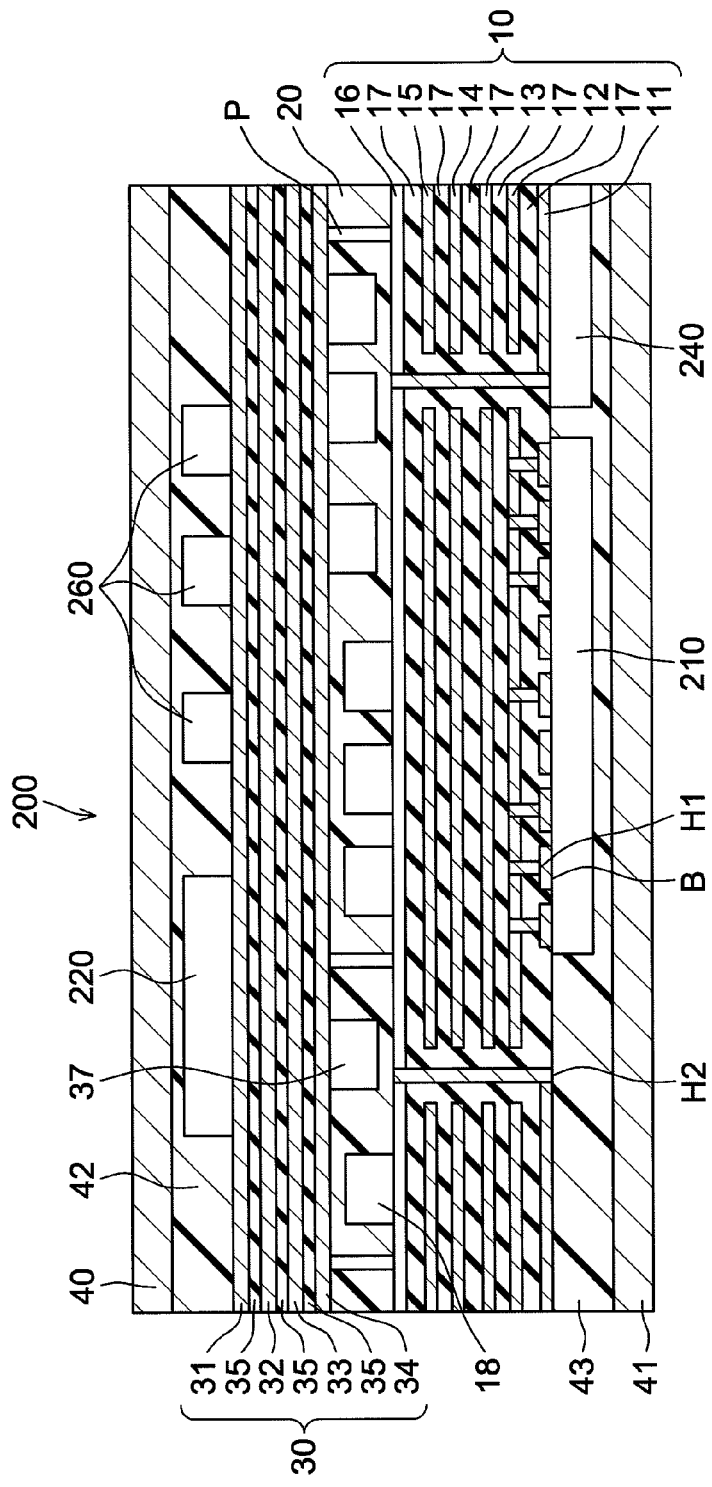
FIG. 15 illustrates a PLC circuit module according to a third embodiment.

A third embodiment is explained below. In the third embodiment, a PLC module has a structure where heat-dissipating metal layers 40 and 41 are laminated onto upper and lower surfaces of the PLC module obtained in the above-described first embodiment, having composite sheets 42 and 43 respectively in between as shown in FIG. 15, thus allowing effective heat dissipation as the module. Other components are provided in a similar manner to the PLC module according to the first embodiment shown in FIG. 1. Same reference numbers are provided to the same components. The structure above having the heat-dissipating plates on both the upper and lower surfaces expands a heat-dissipating space even when the circuit density increases, and provides a compact and affordable module. Described herein is a case where there are two heat-dissipating metal plates, but one metal plate may be used. For instance, providing the metal plate only to an IC having the largest heat generation (e.g., a main IC) via a composite sheet, can expand a heat-dissipating surface.

Fourth Embodiment

Figure 16:
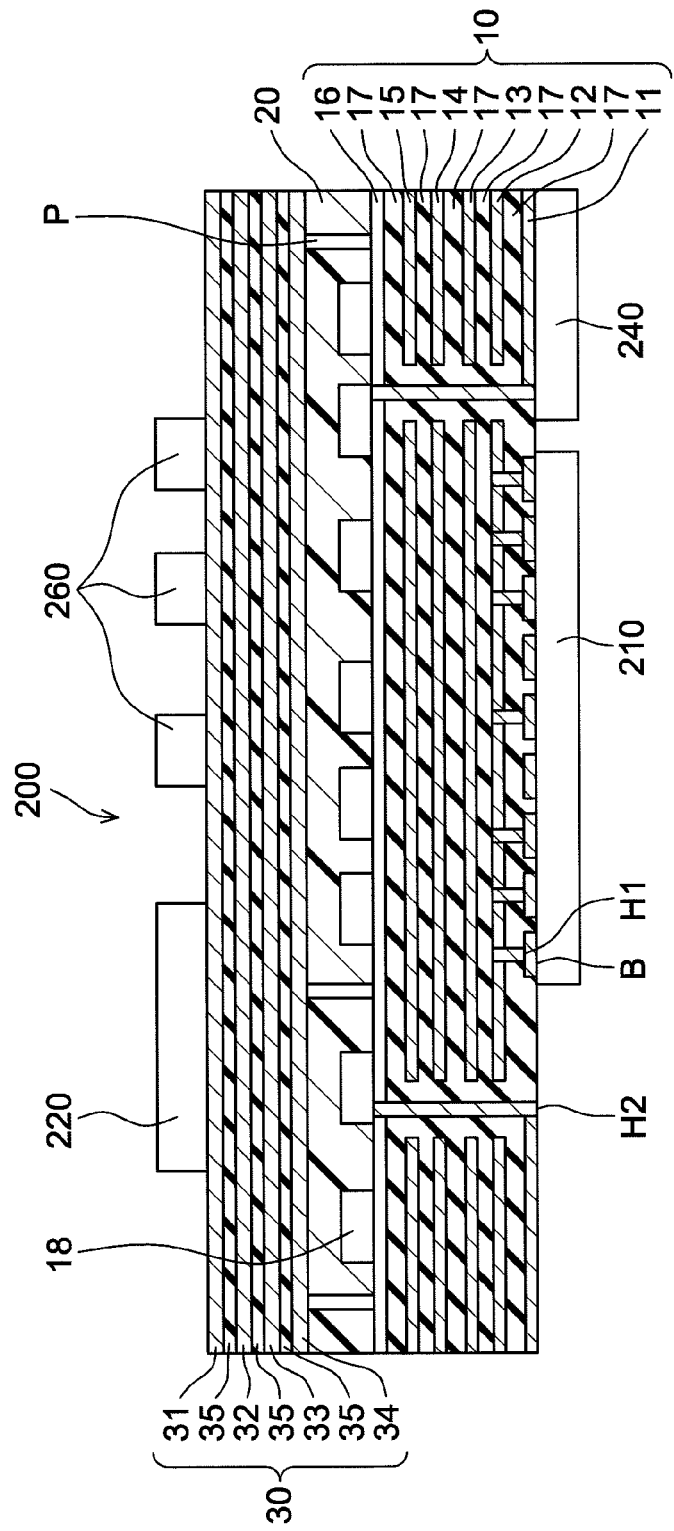
FIG. 16 illustrates a PLC circuit module according to a fourth embodiment.

A fourth embodiment is explained below. In the fourth embodiment, circuit components 18 are mounted on a surface contacting an insulating sheet, which is sandwiched by two laminated boards, and are integrated on a thicker laminated board side, as shown in FIG. 16.

In the fourth embodiment, circuit components 18 mounted on the surface contacting the insulating sheet are integrated on the thicker laminated board side, thus preventing a thin board from bending, and improving connection reliability of a conductive path that connects the two laminated boards when the boards are laminated along with the composite sheet.

Fifth Embodiment

Figure 17:
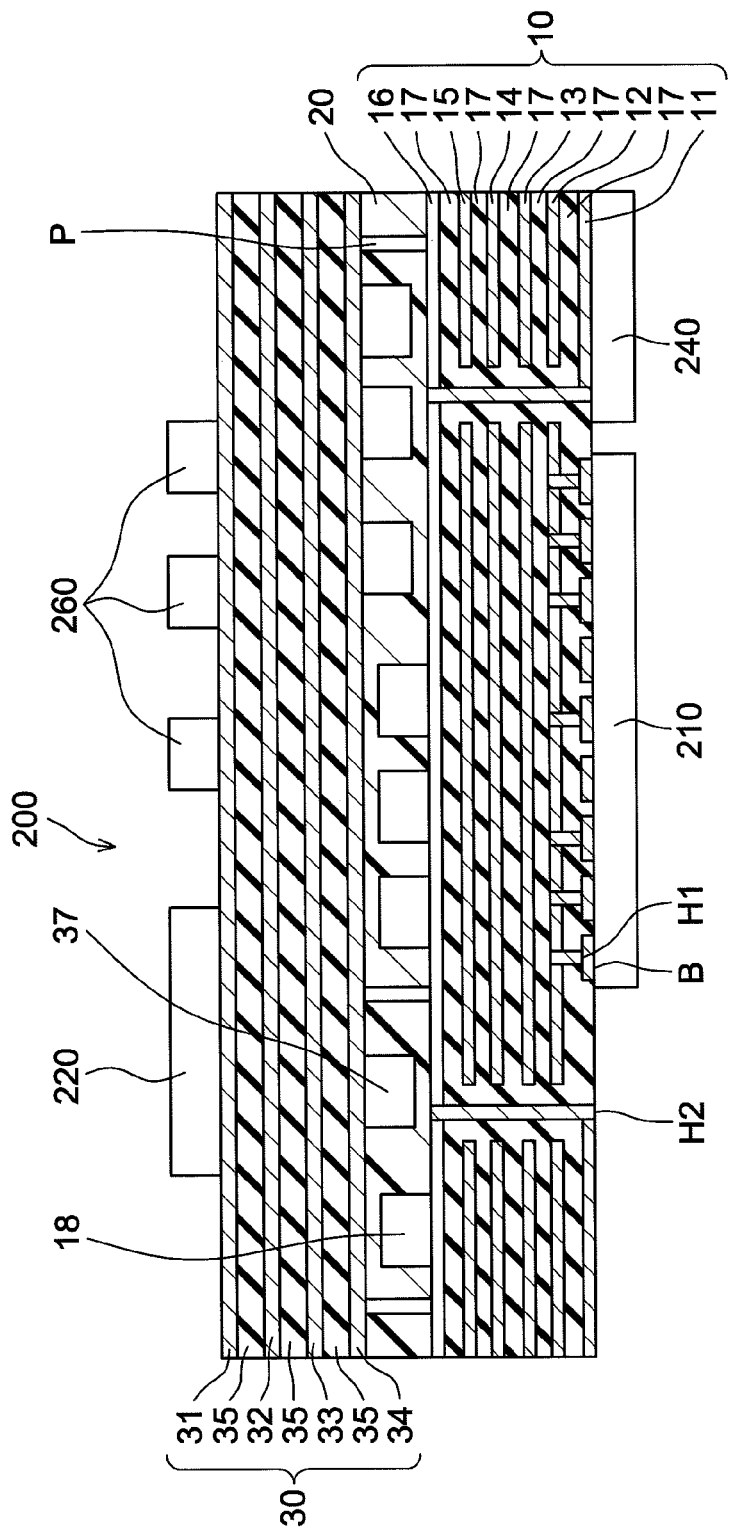
FIG. 17 illustrates a PLC circuit module according to a fifth embodiment.
Figure 18:
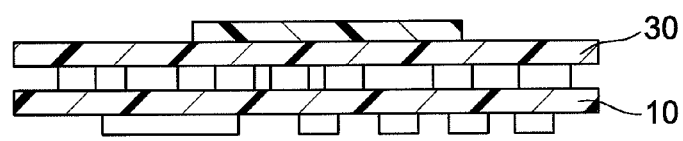
FIG. 18 illustrates a PLC circuit module according to a sixth embodiment.
Figure 19:
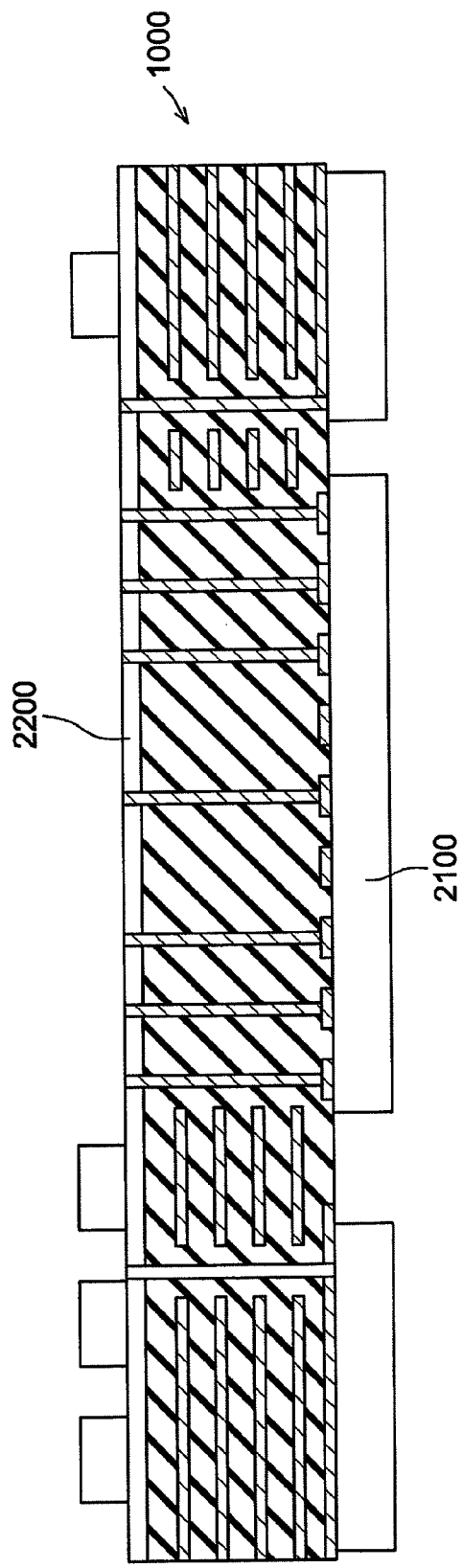
FIG. 19 illustrates a conventional PLC module.

A fifth embodiment is explained below. In the fifth embodiment, two laminated boards opposed to a side where components are included, have the same thickness, as shown in FIG. 17.

In the fifth embodiment, providing the same thickness to two laminated boards 10 and 30, reduces shear stress caused by a difference in thermal expansion of the boards, thereby improving connection reliability of a conductive path when the boards are laminated along with composite sheet 20.

Sixth Embodiment

A sixth embodiment is explained below. In the first through fifth embodiments, two laminated boards are laminated having composite sheet 20 therebetween. In the sixth embodiment, however, two laminated boards 10 and 30 opposed to a side where components are included, are connected using circuit component 21, thus simplifying the structure.

The structure above eliminates a punching process and the like so as to provide on a composite sheet, a portion for a circuit component or a portion filled with conductive paste, as shown in FIG. 10C, thereby providing an affordable module that allows easy mounting.

In the above-described first through sixth embodiments, the main IC that modulates and demodulates a multicarrier signal is explained as an example of the IC that connects the plurality of ground terminals to the ground layer. However, such an IC is not limited to the main IC. The similar effect can also be obtained, for example, when a plurality of ground terminals and a ground layer of an AFE IC are connected.

The IC mounting board according to the above-description is configured to be resistant to heat fluctuation and noise. Therefore, it is possible to apply the IC mounting board to various technologies, including the high-speed power line communication.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention. In the embodiments, the circuit module having a plurality of ground terminals all of which are connected to metal layer 12 is described. However, a part of the plurality of ground terminals may be connected to metal layer 13, 14, 15, or the like, substantially within a range of effectiveness of the present invention.

This application is based on the Japanese Patent Application No. 2006-110769 filed on Apr. 13, 2006, entire content of which is expressly incorporated by reference herein.

What is claimed is:

1. A circuit module comprising: a first laminated board that has a first insulating layer, a first conductive layer laminated on said first insulating layer, a second insulating layer laminated on said first conductive layer, and a second conductive layer laminated on said second insulating layer; an integrated circuit that is mounted on said first insulating layer and that has a plurality of ground terminals, and performs at least one of modulation and demodulation of a power line communication signal transmitted via a power line that supplies electric power to the circuit module; and a filter that is connected to the power line and mounted on a surface of said circuit module and that outputs a signal which has a continuous frequency range of the power line communication signal, the filter being mounted on a surface different from said first insulating layer; wherein the power line communication signal is filtered by the filter connected to the power line and output on the power line; said first conductive layer is electrically connected to said plurality of ground terminals, by a plurality of vias, and is not electrically connected to the second conductive layer; and the plurality of vias penetrate only the first insulating layer, and do not penetrate the second insulating layer, wherein the power line has a pair of lines.

2. The circuit module according to claim 1, wherein said filter is a balanced filter that has substantially equal impedance from the pair of lines.

3. A power line communication apparatus having the circuit module according to claim 1, further comprising:
   a coupler that superimposes the power line communication signal output from said circuit module onto an AC voltage transmitted to the power line, and that separates the power line communication signal from the AC voltage transmitted via the power line so as to output the signal to the circuit module.

4. The circuit module according to claim 1, further comprising:
   a second laminated board that has a plurality of laminated conductive layers having insulating layers in between and that is different from said first laminated board;
   a circuit element that is mounted on a surface of said second laminated board; and an insulating sheet that has a conductive path provided between said first and second laminated boards and electrically connects said integrated circuit and said circuit element.

5. The circuit module according to claim 1, wherein the second conductive layer is a foil.

6. The circuit module according to claim 4, further comprising:
an internal circuit element that is provided to said insulating sheet and that is mounted in the circuit module, wherein
said internal circuit element is surrounded by said conductive path.

7. The circuit module according to claim 4, wherein said first and second laminated boards have a same thickness.

8. The circuit module according to claim 4, further comprising:
at least one internal circuit element that is provided to said insulating sheet and that is mounted in the circuit module, wherein
said internal circuit element is mounted on a thicker laminated board of said first and second laminated boards.

9. The circuit module according to claim 4, further comprising:
a heat-dissipating plate that is provided to at least one of said first and second laminated boards.

10. The circuit module according to claim 4, wherein said insulating sheet includes an inorganic filler and thermoset resin.

11. The circuit module according to claim 10, wherein said inorganic filler included in said insulating sheet has a weight percentage range of about 70% to about 95%.

12. A circuit module comprising: a laminated board that has a first insulating layer, a first conductive layer laminated on the first insulating layer, a second insulating layer laminated on the first conductive layer, and a second conductive layer laminated on the second insulating layer; an integrated circuit that has a plurality of ground terminals and that processes a power line communication signal transmitted via a power line that supplies electric power to the circuit module; and a filter that is connected to the power line and mounted on a surface of the circuit module and that outputs a signal which has a continuous frequency range of the power line communication signal, the filter being mounted on a surface different from said first insulating layer; wherein the power line communication signal is filtered by the filter connected to the power line and output on the power line,
said integrated circuit is mounted on said first insulating layer;
said plurality of ground terminals are electrically connected to said first conductive layer, by a plurality of vias; and said first conductive layer is not electrically connected to said second conductive layer, and the plurality of vias penetrate only the first insulating layer, and do not penetrate the second insulating layer, wherein the power line has a pair of lines.

13. The circuit module according to claim 12, wherein
the power line communication signal is transmitted via the power line that has the pair of lines, and
said filter is a balanced filter that has substantially equal impedance from the pair of lines.

14. The circuit module according to claim 12, wherein the second conductive layer is a foil.

15. The circuit module according to claim 13, wherein the power line communication signal has a frequency range of 1.705 MHz to 80.0 MHz.

* * * * *